(12) United States Patent
Thoma et al.

(10) Patent No.: US 7,496,119 B2
(45) Date of Patent: Feb. 24, 2009

(54) EXTERNAL CAVITY LASER WITH MULTIPLE STABILIZED MODES

(75) Inventors: Peter Thoma, Rottenburg (DE); Emmerich Mueller, Aidlingen (DE); Bernd Nebendahl, Ditzingen (DE)

(73) Assignee: Agilent Technologies, Inc., Santa Clara, CA (US)

( * ) Notice: Subject to any disclaimer, the term of this patent is extended or adjusted under 35 U.S.C. 154(b) by 309 days.

(21) Appl. No.: 11/149,780

(22) Filed: Jun. 10, 2005

(65) Prior Publication Data
US 2006/0039424 A1 Feb. 23, 2006

(30) Foreign Application Priority Data
Aug. 18, 2004 (EP) ................... 04103969

(51) Int. Cl.
*H01S 3/13* (2006.01)
(52) U.S. Cl. ................. 372/29.02; 372/29.016
(58) Field of Classification Search .............. 372/29.02, 372/21, 12, 29.01, 29, 32; 343/755
See application file for complete search history.

(56) References Cited

U.S. PATENT DOCUMENTS

| | | | |
|---|---|---|---|
| 5,331,651 A * | 7/1994 | Becker et al. | 372/32 |
| 5,602,864 A * | 2/1997 | Welch et al. | 372/50.11 |
| 6,816,517 B2 * | 11/2004 | Jacobowitz et al. | 372/20 |
| 2002/0172239 A1 * | 11/2002 | McDonald et al. | 372/20 |
| 2003/0007522 A1 * | 1/2003 | Li et al. | 372/20 |
| 2003/0016707 A1 * | 1/2003 | McDonald et al. | 372/20 |
| 2003/0058901 A1 * | 3/2003 | Jacobowitz et al. | 372/20 |
| 2003/0067946 A1 * | 4/2003 | Wiemeyer | 372/29.02 |
| 2003/0142702 A1 * | 7/2003 | Pontis et al. | 372/20 |
| 2004/0042083 A1 * | 3/2004 | Turner | 359/578 |
| 2004/0091001 A1 * | 5/2004 | Sochava et al. | 372/20 |

FOREIGN PATENT DOCUMENTS

| | | |
|---|---|---|
| EP | 0 552 394 A1 | 7/1993 |
| EP | 0762573 A1 | 3/1997 |
| EP | 1 202 409 A1 | 5/2002 |
| WO | WO 02/075874 A1 | 9/2002 |

OTHER PUBLICATIONS

EP Search Report, Sep. 29, 2004.

* cited by examiner

*Primary Examiner*—Minsun Harvey
*Assistant Examiner*—Tuan N. Nguyen
(74) *Attorney, Agent, or Firm*—Marc Bobys

(57) ABSTRACT

A laser apparatus for providing a stabilized multi mode laser beam includes an external cavity for providing an optical path for generating a laser beam which is stimulated by a gain medium, where the external cavity has first spectral characteristics, and a mode-selecting filter positioned within the optical path and having second spectral characteristics. The first characteristics and the second characteristics are adjusted to each other, so that the laser beam has at least two selected modes.

12 Claims, 3 Drawing Sheets

EXTERNAL CAVITY LASER WITH MULTIPLE STABILIZED MODES

BACKGROUND ART

The present invention relates to external cavity lasers.

An external cavity laser comprises a cavity that provides an optical path so that a laser beam, stimulated by a gain or active medium, can resonate. The optical spectrum of an external cavity laser is limited by the spectral region over which the gain medium yields optical gain. Depending on the geometry of the cavity, the laser radiation has certain allowed spectral modes, also referred to as longitudinal modes. The spectral modes correspond to different distinct wavelengths or frequencies of the light. The allowed radiation spectrum in a laser cavity thus is a discrete distribution of modal frequencies limited by the gain curve. Examples of external cavity lasers can be found in U.S. Pat. No. 5,331,651, EP-A-0 552 394 and in EP-A-1 202 409.

U.S. Pat. No. 5,331,651 discloses a tunable Fabry Perot etalon to be used in an external cavity laser comprising a semiconductor laser chip and adjustable diffraction grating. The adjustable diffraction grating is used for a coarse measurement of the laser output wavelength and the etalon is used for the fine adjustment.

SUMMARY OF THE DISCLOSED EMBODIMENTS

It is an object of the invention to provide a laser apparatus with an external cavity for a stable resonation at multiple selected modes. The object is solved by the independent claims. Preferred embodiments are shown by the dependent claims.

According to an embodiment of the present invention, a laser apparatus comprising an external cavity that provides an optical path for generating a laser beam stimulated by a gain medium, the external cavity having a first spectral characteristic, and further comprises a mode-selecting filter mounted within the optical path, having a second spectral characteristic. The spectral response of such an arrangement corresponds to a multiplication of the spectra of the cavity and the mode-selecting filter(s). Thus, all that modes are selected that fall within the pass bands of the resulting spectrum. In order to achieve a matching of the mode-selecting filter and the external cavity, the first characteristic and the second characteristic are adjusted to each other, e.g. by design, by open loop control or by closed loop control, so that the laser beam comprises at least two selected modes.

Preferably, the selected modes substantially comprise all the same optical power.

In an embodiment the laser apparatus comprises an adjustment device to tune (for re-adjusting or changing) the first characteristics and the second characteristics.

In a further embodiment, the laser apparatus comprises measurement means for determining a physical property related to the laser apparatus, e.g. the optical power of the laser beam and a feed back loop to the adjustment device. On the base of the measured physical property, a control signal is generated to control the adjustment device such, that a matching of the external cavity and the mode-selecting filter is kept.

In order to achieve a lasing on at least two modes with a narrow bandwidth or high finesse periodical filter, constant gain is required at the corresponding pass bands. The invention has the advantage that variations of laser apparatus characteristics over the time, e.g. due to environmental conditions or to aging, leading to a mismatch of the spectral characteristics and thus resulting in a reduced modal power and instabilities of optical power can be avoided.

In a further embodiment, the adjustment means are adapted to adjust the first characteristics and the second characteristics by changing the geometry of the external cavity, e.g. the cavity length or the refractive index within the optical path and/or the geometry of the mode-selecting filter. It is also possible to adjust the characteristics by changing the refractive index of the material conducting the laser beam.

In a further embodiment, the mode-selecting filter consists of at least one periodical filter, so that the first characteristics and the second characteristics can be expressed as a first spectral range (FSR1) of the external cavity and a second free spectral range (FSR2) of the mode-selecting filter respectively. The adjustment means are adapted to adjust said characteristics such that the ratio between the first free spectral range (FSR1) and the second free spectral (FSR2) range is substantially a rational number, especially a natural number.

In a further embodiment, an opto-electrical converter is comprised for receiving a portion of the laser beam, that can be coupled out by means of a high reflectivity mirror at one end of the external cavity that reflects the main portion of the resonating laser beam and transmits a small portion (e.g. 5%) to the opto-electrical converter. The opto-electrical converter generates an electrical detection signal that is proportional to the actual power of the laser beam.

In further embodiment, band pass filtering means are comprised for generating an electrical output signal out of the electrical detection signal by letting through only down-mixed frequencies, i.e. signal portions at differences of frequencies of different laser modes, and blocking the offset voltage and non down-mixed high frequencies.

In a further embodiment, a control unit is comprised for receiving the detection signal or a signal derived from the detection signal (e.g. derived by means of filtering) and generating a control signal for tuning (i.e. adjusting the spectral characteristics of) the at least one of the external cavity and the mode-selecting filter.

In a further embodiment, the control signal controlling the spectral characteristics (FSR1, FSR2) of at least one of the external cavity and the mode-selecting filter is composed of an offset value corresponding to a desired wavelength displacement between selected peaks and a modulation signal for modulating said free spectral range and wherein the offset value is determined on the base of an averaged value of a multiplication of the detection signal and the modulation signal.

In a further embodiment, environmental conditions such as temperature and/or pressure are controlled so that the initial settings of the spectral characteristics (FSR1, FSR2) are maintained. Thus, the spectral characteristics are indirectly controlled without a need to build up a feed back loop over a detector and a control unit to an actuator of the external cavity or the mode-selecting filter. This method can also be applied additionally to a feedback control of said devices.

The external cavity preferably comprises one of active mode locking means and passive mode locking means. For an active mode locking, an electrical modulation of an optical element of the external cavity is performed, e.g. by a modulation of gain medium itself or of by a modulation of a controllable attenuator positioned within the optical path of the external cavity, e.g. by means of an electro absorption modulator (EAM) or a Mach Zehnder modulator.

The mode-selecting filter might comprise or consist of one of a Fabry Perot etalon, an acousto-optical filter, a ring resonator, a Michelson interferometer, and a Mach Zehnder interferometer.

The invention can be partly or entirely embodied or supported by one or more suitable software programs, which can be stored on or otherwise provided by any kind of data carrier, and which might be executed in or by any suitable data processing unit.

In an embodiment, a software program or product for controlling the laser apparatus is comprised for executing in the control unit the method of receiving an electrical detection signal coming from the detection unit that is proportional to the power of the laser beam and generating a control signal to be applied to adjustment means of at least one of the external cavity and mode selecting filter, so that the laser beam comprises at least two selected modes.

BRIEF DESCRIPTION OF THE DRAWINGS

Other objects and many of the attendant advantages of embodiments of the present invention will be readily appreciated and become better understood by reference to the following more detailed description of preferred embodiments in connection with the accompanied drawings. Features that are substantially or functionally equal or similar will be referred to with the same reference signs.

DETAILED DESCRIPTION OF THE EMBODIMENTS

Figure 1:
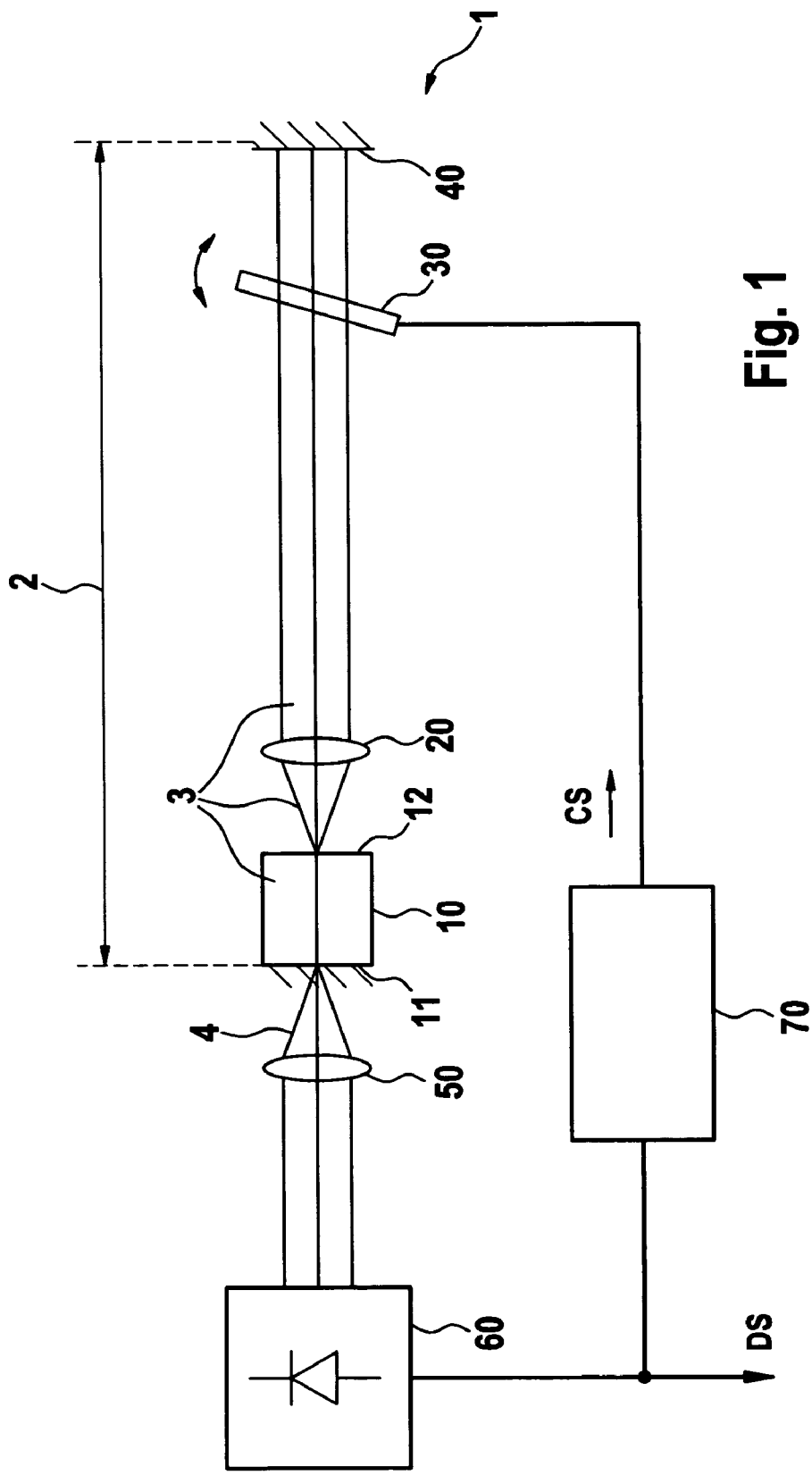
FIG. 1 shows a schematic block diagram of an exemplarily laser apparatus according to the invention.

Referring now in greater detail to the drawings, FIG. 1 shows a schematic view of an exemplarily laser apparatus 1 according to the invention. The laser apparatus 1 comprises an external cavity 2 in which a laser light is provided by a gain medium 10, e.g. a laser diode, to external cavity 2. A beam 3 travels along a path between a first cavity end element 11, forming a first end of gain medium 10 and a second cavity end element 40, both cavity end elements 11 and 40 constituting external cavity 2. The end elements both provide a high reflectivity. A first collimating lens 20 is provided closely to a second end 12 of gain medium 10 within external cavity 2. External cavity 2 further comprises a tunable mode-selecting filter 30 introduced in the path of beam 3 for selecting two or more modes out of a comb of longitudinal modes of beam 3. External cavity 2 further comprises an output for emitting an output beam 4 as a portion of beam 3, collimated by a second collimating lens 50 and detected by an optical detector 60. A control unit 70 is electrically connected to each optical detector 60 and tunable mode-selecting filter 30.

Additionally, a further gain medium can be inserted (together with a corresponding further collimating lens) into the optical path in front of the second end element 40.

External cavity 2 allows beam 3 resonating at specific wavelengths or lines, i.e. it allows for the forming specific laser modes. Tunable mode-selecting filter 30 selects at least two modes out of these allowed or possible modes.

In order to achieve a generation of a plurality of modes over a broad wavelength range, it is important to minimize the chromatic dispersion of the optical path. Therefore, the gain medium 10 and the mode selecting filter 30 can be chosen such, that the optical path is substantially free of any chromatic dispersion. Alternatively, a further optical device with a tunable negative dispersion is inserted in the optical path to compensate for the dispersion of the gain medium and the optical filter.

As an example, two modes are selected with frequencies of 190 Tera Hertz (THz) as first mode frequency f1 and at 190 THz+12 Giga Hertz (GHz) as second mode frequency f2. Detector 60 receives a portion of output beam 4 and generates an electrical current that is proportional to the optical power of beam 3. The optical power of output beam 4 is a function that can be seen as a superposition of a constant function and a plurality of sinusoidal functions. For the example with two modes, this signal comprises five portions:

a constant function representing the mean optical power of output beam 4, a sinusoidal function with a frequency of two times the first mode frequency (2·f1), a sinusoidal function with a frequency of two times the second mode frequency (2·f2), a sinusoidal function with a frequency of the sum of the first and second mode frequency (f1+f2), and a sinusoidal function with a frequency of the difference of the first and second mode frequency (f2−f1), the so-called mixed signal.

As detector 60 has low pass characteristics, it substantially only detects the constant part and the mixed part of the power of beam 3 and thus generates detection signal DS as sinusoidal function of the frequency difference f2−f1 (e.g. 12 GHz according to the above example) with a certain offset. The electrical line receiving detection signal DS preferably has band pass characteristics so that the offset is suppressed. Thus, as result a sinusoidal signal is generated of only one frequency. The frequency of this signal is very stable so that apparatus 1 forms a high quality opto-electrical oscillator.

However, without controlling the matching of external cavity 2 and mode-selecting filter 30, it might happen that one of the originally selected modes disappears due to a shift of the spectral characteristics of external cavity 2 and/or of mode-selecting filter 30 due to environmental changes (e.g. the temperature). Therefore, control unit 70 is provided for controlling the characteristics of mode-selecting filter 30 to ensure a stabilized lasing at the selected modes. Control unit 70 therefore generates control signal CS, that is based on an evaluation of detection signal DS.

Mode-selecting filter 30 can be realized as a periodical filter, e.g. as Fabry Perot (FP) etalon, ring resonator, acousto-optical filter, Mach-Zender Interferometer, or a Michelson Interferometer.

For the example of using an FP etalon as mode-selecting filter 30, this filter is mounted pivotable by an actuator (not shown) (indicated by the double arrow in FIG. 1) around a pivot axis perpendicular to the optical axis of external cavity 2. Depending on control signal CS, the actuator rotates the etalon into a determined position. By rotating the etalon, the free spectral range of the etalon changes. Further details of adjusting the free spectral range of an FP etalon by changing the angle of incidence are described in U.S. Pat. No. 5,331,651.

Alternatively to tuning the mode-selecting filter 30, the external cavity 2 is tuned for adjusting first spectral characteristics FSR1 of the cavity to the second spectral characteristics FSR2 of the mode-selecting filter 30 (the spectral characteristics of mode-selecting filter is the free spectral range FSR2, if a periodical filter is used). Therefore, e.g. second cavity end element 40 is mounted on one end of an electrically driven piezo-electric element (not shown), which provides a movement along the optical axis and thus allows for changing the length of the optical path. One end of the piezo-electric element is movable whereas the other end of the piezo-electric element is fixed relative the cavity 2. Providing a voltage to the piezo-electric element, second cavity end element 40 is moved along the optical axis, either towards or away from first cavity end element 11, so that first free spectra range is changed according to the movement. Generally, adjusting the first spectral characteristics can be carried out by changing the path length directly (by moving cavity elements) or indirectly (e.g. by controlling the temperature, pressure, electric or magnetic field), by adding optical devices with different refractive indices or by controlling the refractive index of optical devices within the path. Therefore, optical devices of LCD or LiNb03 can be used that change the refractive index depending on the applied electrical field.

Alternatively to only tuning either external cavity 2 or mode-selecting filter 30, both devices might be tuned. Such an arrangement offers a great flexibility and a wide adjustment range.

Further alternatively, the alignment of the spectral characteristics of external cavity 2 and mode-selecting filter 30 is ensured by controlling the environmental conditions of the setup so that an optimal tuning of apparatus 1, once established before operation, e.g. during construction or in maintenance phases, is maintained during operation.

Preferably, the external cavity further comprises active mode locking means or passive mode locking means (not shown in FIG. 1). Active mode locking means e.g. comprise a tunable attenuator or gain modulated according to an attenuator control signal that might be generated additionally by control unit 70 or by a separate control unit. Mode locking means are used to prevent from mode competition and thus stabilize the modes chosen.

Alternatively to external cavity 2 with two cavity end elements, an external cavity might be realized as a ring, wherein beam 3 circulates along an optical path formed e.g. by three or more mirrors or a curved waveguide (e.g. a fiber).

Instead of using one single mode-selecting filter 30, an arrangement of two or more filters, e.g. two filters positioned in series, is used. The resulting transmission spectrum of an arrangement with filters positioned in series is the multiplication result of the transmission spectra of these filters.

In the following, the adjustment of external cavity 2 and mode-selecting filter 30 to each other is described in more details.

Figure 2:
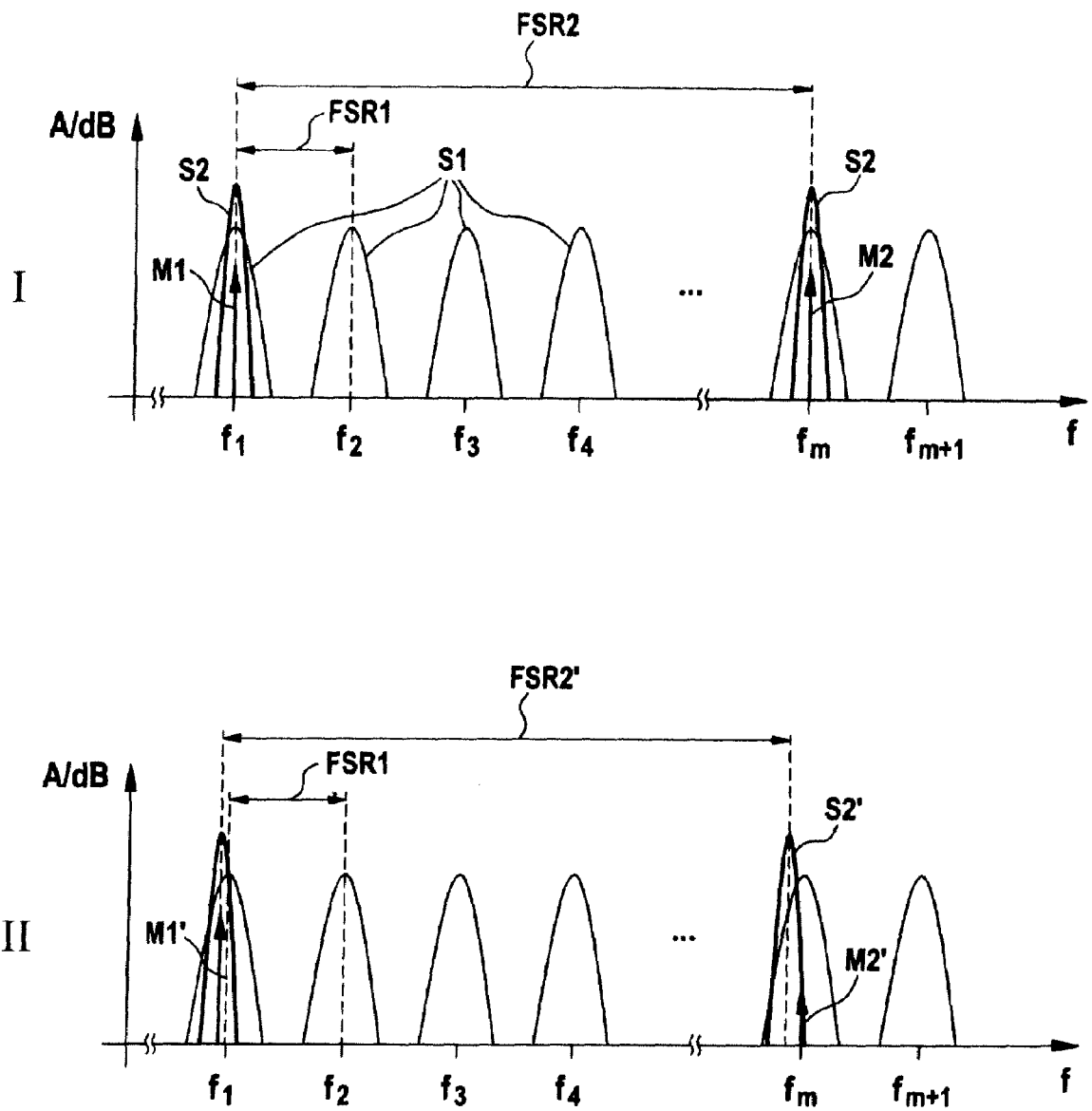
FIG. 2 shows schematic diagrams with spectra of an external cavity and spectra of an mode-selecting filter positioned within the optical path of the external cavity, once optimally matched and once not optimally matched

FIG. 2 is a graphical representation of the filter spectra of external cavity 2, of mode-selecting filter 30 and of the resulting light intensity of laser beam 3 (and thus also of beam 4) as a function of the wavelength $\lambda$ (abscissa). The light intensity is denoted in intensity attenuation in a logarithmic scale A/dB (ordinate). A first diagram I in the upper part shows an optimal matching of a first spectrum S1 of external cavity 2 shown in FIG. 1 and a second spectrum S2 of mode-selecting filter 30 shown in FIG. 1 with two resulting laser modes M1 and M2 with substantially similar power. A second diagram in the lower part a sub-optimal matching of those devices with two modified modes M1' and M2' having substantially different power. It is understood that the shapes the spectra S1 and S2 in FIG. 2 (and in FIG. 3 too) are no measurement results of real devices and serve only for describing the invention.

According to FIG. 1 and by way of example, the cavity spectral characteristics are kept fix, whereas the filter function of mode-selecting filter, (or generally the transmission spectrum S2 of mode-selecting filter arrangement comprising one or a plurality optical filters) is tuned or matched to the accordingly fixed transmission spectrum S1.

First diagram I shows first spectrum S1 of external cavity 2 with a number first peaks at frequency $f_1, f_2, f_3, f_4, \ldots, f_m$, $f_{m+1}$, substantially equally spaced with a first frequency distance or first free spectral range FSR1 between two adjacent peaks and a spectrum S2 with second peaks at first and frequencies $f_1$ and $f_m$, with a second frequency distance or second free spectral range FSR2. By way of example the second peaks are relatively narrow compared to the first peaks, i.e. the finesse of mode-selecting filter is greater than the finesse of external cavity 2. Second free spectral range FSR2 is an exact multiple of first spectral free range FSR1 and thus peaks of both spectra S1 and S2 are centered around frequencies $f_1$ and $f_m$; thus both external cavity 2 and mode-selecting filter 30 are tuned so that the filter characteristics are optimally matched.

Second diagram II distinguishes from first diagram 1 in that the free spectral range of mode-selecting filter 30, further referred to as misaligned free spectral range FSR2', is not an exact multiple of first free spectral range FSR1 and thus peaks of first spectrum S1 and consequently modified spectrum S2 are not centered around m-th frequency $f_m$ (there might be also a slight shift of the peaks at first frequency $f_1$); thus the filter characteristics of both external cavity 2 and mode-selecting filter 30 are mismatched resulting in a significant reduction of the power of the second selected mode S2'. It is however important to mention that the problem of misalignment is mainly due the potential change of power over the time; it is not necessary that the power of the selected modes is equal or substantially equal, as long as all selected modes have sufficient power.

By way of example the second peaks are relatively narrow compared to the first peaks, i.e. the finesse of mode-selecting filter 30 is greater than the finesse of external cavity 2. The finesse F being a figure of merit for the transmission bandwidth is defined by the formula:

F=FSR/FWHM where FSR is the free spectral range of the interferometer or etalon, and FWHM is the full width of the corresponding transmission peak at its 50% point. The FSR of a periodic optical device (filter or cavity) is defined as being the distance (in frequency space) between adjacent transmission peaks. In a cavity or in a FP interferometer with plane-parallel end elements, the FSR is given by the equation FSR=c/2nL, where c is the speed of light, L the spacing between reflecting end surfaces, and n is the index of refraction of the material between the reflecting end surface.

In the following, an exemplary principle for controlling the filter matching will be described, wherein a frequency modulation of mode-selecting filter 30 will result in an amplitude modulation of the generated beam. Therefore, FIG. 3 shows at the left side a selected mode out of the laser modes and a part of mode-selecting filter 30 and each with a first peak P1 being the selected mode and a second peak P2 being a part of second spectrum S2 as a function of the wavelength $\lambda$ (abscissa).

In the following example, the external cavity characteristics are tuned, e.g. by varying the external cavity length (It is also possible to tune the filter characteristics by varying mode-selecting filter 30). Second peak P2 is centered on a first center wavelength $\lambda_{C1}$ and first peak P1 is modulated around second center wavelength $\lambda_{C2}$, said modulation indicated by a double arrow m. In this first example, the average wavelength shift or displacement $\Delta\lambda=\lambda_{C2}-\lambda_{C1}$ is positive. Peaks P1 and P2 might correspond to laser mode M2' and to a peak of spectrum mismatched spectrum S2' centered on frequencies $f_m-\Delta f$ and $f_m$ respectively shown in second diagram II of FIG. 2 (frequency and wavelength are related by the function: c/f=λ). At the ordinate, filter attenuation A/dB is again denoted at a logarithmic scale.

Figure 3:
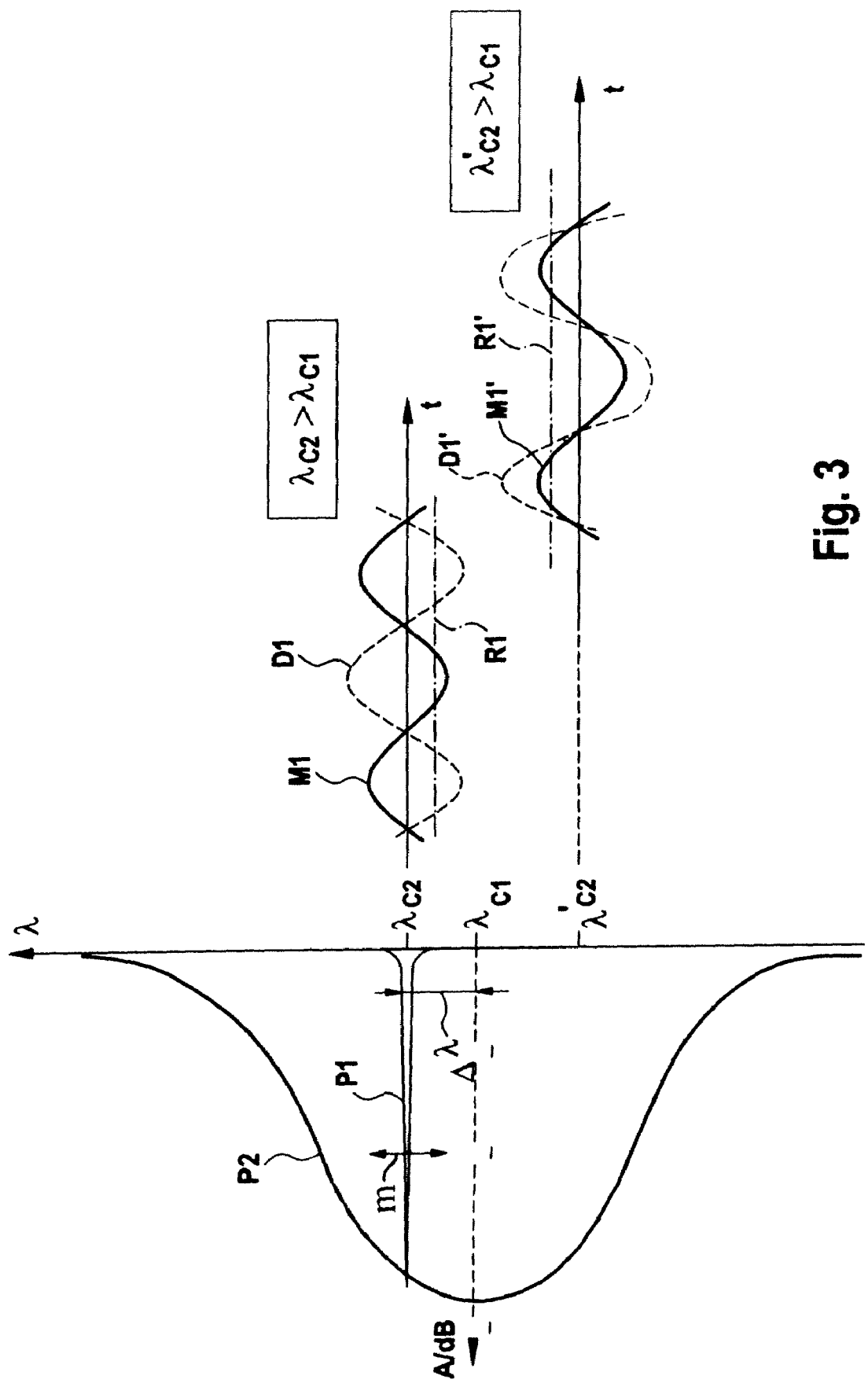
FIG. 3 shows a schematic diagram illustrating a generation of control signals for controlling the filter matching.

FIG. 3 further shows for a first example with displacement Δλ>0 and for a second example with displacement Δλ<0, each an exemplary first or second detection signal D1 or D1', a first or second modulation signal M1 or M1' and a first or second result signal R1 or R1' respectively, said first or second result signal R1 or R1' resulting from averaging the result of a multiplication of the corresponding detection signal and modulation signal.

Example with displacement Δλ>0: First (filter) modulation signal M1 is a sinusoidal part of control signal CS, said control signal having additionally a modulation offset. Control signal CS is provided to the actuator of mode-selecting filter 30 for tuning the external cavity characteristics (here: free spectral range) FSR1 and thus for tuning thus second center wavelength $\lambda_{C2}$. In order to get a feedback information of the actual alignment or adjustment of both the cavity characteristics FSR1 and the filter characteristics FSR2, control signal CS is composed of an offset signal (that has a value such that external cavity 2 exhibits a wavelength displacement of Δλ) and a periodical function (that e.g. is a sinusoidal function of a frequency of e.g. 1 Kilo Hertz) so that the second center wavelength is modulated around second center wavelength $\lambda_{C2}$. As the optical power of beam 3 resonating in external cavity decreases with an increasing actual wavelength displacement, the phase of first detection signal D1 has a phase shift of 180 degree compared to first modulation signal M1. Multiplying said signals and determining the average results in a negative result function R1, (that only has a constant value in ideal case). The modulation offset is now determined as function of first result function R1, e.g. being negative proportional to first result function (∼−R1).

Example with displacement Δλ<0: This example distinguishes over the first example in that the phase of second detection signal D2 has no phase shift compared to second modulation signal M2. Multiplying said signals and determining the average results in positive result function R2, and thus in a negative modulation offset.

External cavity 2 can be modulated up to a wavelength displacement Δλ of at least a fraction of the first free spectral range FSR1. The maximum allowable wavelength displacement Δλ in an application as described above is dependant on the filter width (FWHM) and the finesse (F) of the applied filters.

It is also possible to control mode-selecting filter to a displacement of zero: Δλ=0. In this case, averaging the multiplication of the corresponding detection and modulation signals equals to zero.

The modulated transmission signal is thus used to open loop or closed a loop control of the displacement Δλ between selected peaks of external cavity 2 and mode-selecting filter 30. The displacement Δλ can be controlled to Δλ=0 or to Δλ=a, a being a positive or negative wavelength value depending on the spectral characteristics of the used optical devices and the requested signal behavior.

The invention claimed is:

1. A laser apparatus for providing a stabilized multi mode laser beam, comprising:
    an external cavity providing an optical path for generating a laser beam which is stimulated by a gain medium, said external cavity having a first free spectral range and
    a mode-selecting filter positioned within the optical path and having a second free spectral range,
    an adjustment device for adjusting the first and second free spectral ranges to each other by adjusting at least one of an optical path length of the external cavity and a transmission spectrum of the mode selecting filter, so that the laser beam comprises at least two selected modes;
    laser apparatus further comprising a filter for generating an electrical output signal derived from the down-mixed frequencies of the two selected modes.

2. The apparatus of claim 1, further comprising:
    a measurement unit for determining a physical property related to the laser apparatus and for generating a corresponding control signal,
    wherein the adjustment device is configured to adjust the first and second free spectral ranges to each other in dependence of said control signal.

3. The apparatus of claim 2, wherein the measurement unit is an opto-electrical converter configured for receiving a portion of the laser beam and generating an electrical detection signal that is proportional to the actual power of the laser beam.

4. The apparatus of claim 3, comprising a control unit configured to receive the detection signal or a signal derived from the detection signal and for generating a control signal to be provided to at least one of the external cavity and the mode-selecting filter for adjusting the first and second free spectral ranges to each other.

5. The apparatus of claim 4, wherein the control unit is configured for generating a control signal that is composed of an offset value corresponding to a desired wavelength displacement between selected peaks and a modulation signal for modulating at least one of the first and second free spectral ranges and wherein the offset value is determined on the base of an averaged value of a multiplication of the detection signal and the modulation signal.

6. The apparatus of claim 4, wherein the control unit is configured for controlling environmental conditions such that an initial setting of the free spectral ranges is maintained.

7. The apparatus of claim 1, wherein the adjustment device is configured to adjust the first and second free spectral ranges by changing at least one of a geometry and a refractive index of at least one of the external cavity and the mode-selecting filter.

8. The apparatus of claim 1, wherein the adjustment device is configured to adjust said spectral ranges such that the ratio between the first free spectral range and the second free spectral range is substantially a rational number, or a natural number.

9. The apparatus of claim 1, wherein the external cavity further comprises one of active mode locking means and passive mode locking means.

10. The apparatus of claim 1, wherein the mode-selecting filter comprises one of a Fabry Perot etalon, an acousto-optical filter, a ring resonator, a Michelson interferometer, and a Mach Zehnder interferometer.

11. A method of controlling a laser apparatus, wherein the laser apparatus comprises an external cavity with an optical path for receiving a laser beam that is stimulated by a gain medium, said external cavity having a first free spectral range, and a mode-selecting filter positioned within the optical path said mode-selecting filter having a second free spectral range, the method comprising:
    measuring a physical property related to the laser apparatus, and
    adjusting on the base of said physical property at least one of an optical path length of the external cavity and a transmission spectrum of the mode-selecting filter for adjusting the first and second spectral ranges to each other, so that the laser beam comprises two selected modes; and generating an electrical output signal derived from the down-mixed freguencies of the two selected modes.

12. A method for controlling a laser apparatus, said laser apparatus comprising an external cavity having a first free spectral range, and further comprising a mode-selecting filter positioned within an optical path of the external cavity and having a second free spectral range, the method comprising:

receiving an electrical detection signal that is based on a physical property of the laser apparatus, and generating a control signal to be applied to adjustment means of at least one of the external cavity and mode selecting filter for adjusting the first and second free spectral ranges to each other by adjusting at least one of an optical path length of the external cavity and a transmission spectrum of the mode selecting filter, so that a laser beam resonating in the external cavity comprises at least two selected modes, when run on a data processing system of a control unit.

* * * * *